United States Patent
Wu et al.

[11] Patent Number: 6,114,210
[45] Date of Patent: *Sep. 5, 2000

[54] METHOD OF FORMING SEMICONDUCTOR DEVICE COMPRISING A DRAIN REGION WITH A GRADED N-LDD JUNCTION WITH INCREASED HCI LIFETIME

[75] Inventors: David Wu, San Jose; Scott Luning, San Francisco, both of Calif.

[73] Assignee: Advanced Micro Devices, Inc., Sunnyvale, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/979,364

[22] Filed: Nov. 26, 1997

[51] Int. Cl.[7] .................................................. H01L 21/336
[52] U.S. Cl. ........................ 438/302; 438/303; 438/305
[58] Field of Search .................................. 438/263, 264, 438/301, 302, 303, 305, 306, 307, 525, 529

[56] References Cited

U.S. PATENT DOCUMENTS

| | | | |
|---|---|---|---|
| 5,217,910 | 6/1993 | Shimizu et al. | 438/302 |
| 5,270,227 | 12/1993 | Kameyama et al. | 438/302 |
| 5,308,780 | 5/1994 | Chou et al. | 438/302 |
| 5,372,957 | 12/1994 | Liang et al. | 438/302 |
| 5,416,736 | 5/1995 | Kosa et al. | 257/381 |
| 5,631,485 | 5/1997 | Wei et al. | 257/344 |
| 5,759,901 | 6/1998 | Loh et al. | 438/305 |
| 5,793,090 | 8/1998 | Gardner et al. | 257/408 |
| 5,827,774 | 10/1998 | Kitajima | 438/525 |
| 5,830,788 | 11/1998 | Hiroki et al. | 438/302 |
| 5,851,886 | 12/1998 | Peng | 438/302 |
| 5,891,774 | 4/1999 | Ueda et al. | 438/302 |

OTHER PUBLICATIONS

D. Nayak et al., in "A Comprehensive Study of Performance and Reliability of P, As, and Hybrid As/P N–LDD Junctions for Deep–Submicron CMOS Logic Technology," IEEE Electron Device Letters, vol. 18, No. 6, 1997, pp. 281–283.

*Primary Examiner*—Charles Bowers
*Assistant Examiner*—Jack Chen

[57] ABSTRACT

A CMOS semiconductor device is formed having an N-channel transistor comprising a drain region with a graded N-LDD junction. The graded N-LDD junction is obtained by plural ion implantations at different implantation dosages, energies and angles. The graded N-LDD junction reduces the electric field around the drain, thereby increasing the HCI lifetime without adversely impacting the short channel effect.

18 Claims, 2 Drawing Sheets

METHOD OF FORMING SEMICONDUCTOR DEVICE COMPRISING A DRAIN REGION WITH A GRADED N-LDD JUNCTION WITH INCREASED HCI LIFETIME

TECHNICAL FIELD

The present invention relates to a semiconductor device and to a method of manufacturing the semiconductor device having an increased hot carrier injection lifetime. The invention is particularly applicable to high density CMOS semiconductor devices with design features of 0.25 microns and under.

BACKGROUND ART

The escalating requirements for high densification and performance associated with ultra large scale integration semiconductor devices requires design features of 0.25 microns and under, such as 0.18 microns and under, increased transistor and circuit speeds, high reliability and increased manufacturing throughput for competitiveness. The reduction of design features to 0.25 microns and under challenges the limitations of conventional semiconductor manufacturing technology.

The aggressive scaling of gate electrode dimensions into the deep submicron regime, such as less than about 0.25 microns, demands extremely shallow junctions to maintain good short channel characteristics and current drive. For example, semiconductor devices having design features of about 0.25 microns require a significantly reduced lightly doped drain (LDD) junction depth ($X_J$) of less than about 800 Å. Conventional methodology comprises ion implanting an N-type impurity having a low diffusion coefficient, typically arsenic (As). The formation of a sharp N-type impurity (N)-LDD junction requires the power supply voltage ($V_{dd}$) to be reduced in order to maintain sufficient hot carrier reliability. While attractive from a power dissipation standpoint, a lower $V_{dd}$ compromises speed and current drive required for microprocessors, particularly for desktop applications. Thus, hot carrier injection (HCI) reliability has become the limiting factor for performance of N-channel MOSFETs, particularly as the design rules shrink. A reduction in the HCI lifetime is attributed to the sharp N-LDD junction which causes a high peak electric field in the channel region.

Adverting to FIG. 1, a conventional N-channel transistor comprises substrate 10 and gate electrode 11 formed thereon with gate oxide layer 12 therebetween. An N-LDD implant, for subsequently activated N-LDD region 13, is formed by ion implantation using the gate electrode as a mask, usually As because of its low diffusion coefficient, typically at an implantation dosage of about $1 \times 10^{13}$ atoms/cm$^2$ to about $1 \times 10^{14}$ atoms/cm$^2$ at an energy of about 10 KeV to about 30 KeV. Sidewall spacer 14 is then formed on the side surfaces of gate electrode 11 and ion implantation is conducted to form the source/drain region implant for the adjoining subsequently activated N-source/drain region 15 by ion implanting As at an implantation energy of about $1 \times 10^{15}$ atoms/cm$^2$ to about $1 \times 10^{16}$ atoms/cm$^{-2}$ at an energy of about 30 KeV to about 60 KeV. Activation annealing is then conducted at a temperature of about 1,000° C. to about 1,100° C. for about 10 seconds to about 60 seconds, to activate the N-LDD and source/drain regions. The HCI lifetime of such a conventional N-channel transistor is undesirably low due to a high peak electric field in the channel region caused by the sharp junction between N-LDD region 13 and P substrate 10.

D. Nayak et al., in "A Comprehensive Study of Performance and Reliability of P, As, and Hybrid As/P N-LDD Junctions for Deep-Submicron CMOS Logic Technology," IEEE Electron Device Letters, Vol. 18, No. 6, 1997, pp. 281–283, disclose a method of N-LDD junction grading to decrease the peak electric field in the channel, thereby improving the HCI lifetime. The disclosed technique comprises ion implanting As and P to form the N-LDD implant. While this technique was reported to improve the HCI lifetime in semiconductor devices of 0.35 micron technology, such a hybrid As/P-LDD technique cannot be directly applied to semiconductor devices having design features of about 0.25 microns and below, because the Off-current is increased to an unacceptably high level.

In copending application Ser. No. 08/924,644, filed Sep. 5, 1997, a method is disclosed comprising ion implanting a rapidly diffusing N-type impurity, such as P, into a doped (As) source/drain implant after sidewall spacer formation. Upon activation annealing, a graded N-type LDD junction is formed with an attendant significant increase in the HCI lifetime without an increase in the Off-current. In copending application Ser. No. 08/923,996, filed Sep. 5, 1997, a method is disclosed comprising forming a second sidewall spacer, after forming N-type impurity, e.g., As, moderately or heavily doped source/drain implants, and ion implanting a rapidly diffusing N-type impurity, such as P. Upon activation annealing, a P-containing region is formed having a graded junction extending below the source/drain region and sufficiently spaced apart from the channel region to reduce junction capacitance, thereby enabling higher circuit speeds.

As design rules decrease to 0.25 microns and under, the channel length of the channel region becomes smaller and smaller. Consequently, a higher electrical field is generated at the drain region causing hot carrier injection into the gate oxide, thereby degrading transistor performance. In the 0.25 micron regime and under, it is necessary to form the N-LDD implant, such as As, at an implantation dosage of about $10^{14}$ atoms cm$^{-2}$ in order to maintain transistor performance. However, at such a dopant level in a 0.25 micron regime, the N-LDD region effectively shortens the channel length, thereby creating a high electrical field at the drain causing hot carrier injection into the gate dielectric with an attendant degradation in transistor performance.

There exists a need for semiconductor methodology and devices exhibiting an increased HCI lifetime without employing a high diffusivity dopant, thereby avoiding an increase in the $X_J$, without adverse impact on the short channel effect, and without degrading transistor performance. There also exists a need for semiconductor methodology and devices having a design rule of about 0.5 microns and under with an increased HCI lifetime by simplified methodology.

DISCLOSURE OF THE INVENTION

An object of the present invention is a simplified method of manufacturing a semiconductor device exhibiting an improved HCI lifetime and a graded N-LDD junction.

Another object of the present invention is a semiconductor device exhibiting an increased HCI lifetime and a graded N-LDD region junction.

Additional objects, advantages and other features of the invention will be set forth in part in the description which follows and in part will become apparent to those having ordinary skill in the art upon examination of the following or may be learned from the practice of the invention. The objects and advantages of the invention may be realized and obtained as particularly pointed out in the appended claims.

According to the present invention, the foregoing and other objects are achieved in part by a method of manufacturing a semiconductor device, comprising: forming a dielectric layer on a surface of a semiconductor substrate; forming a conductive layer on the dielectric layer; patterning to form a gate electrode, having side surfaces, on the surface of the semiconductor substrate with a gate dielectric layer therebetween; ion implanting a first N-type impurity at a first angle with respect to a line perpendicular to the surface of the semiconductor substrate, at a first implantation dosage and at a first implantation energy to form a first N-type impurity lightly doped drain (N-LDD) implant having a first impurity concentration; ion implanting a second N-type impurity at a second angle with respect to a line perpendicular to the surface of the semiconductor substrate less than the first angle, at a second implantation dosage greater than the first implantation dosage and at a second implantation energy less than the first implantation energy to form a second N-LDD implant having a second impurity concentration greater than the first impurity concentration; and activation annealing to form: a first low concentration N-LDD region extending under the gate electrode from a side surface thereof; and a second high concentration N-LDD region forming a graded junction with the first low concentration N-LDD region.

Another aspect of the present invention is a semiconductor device having an N-channel transistor comprising: a gate electrode, having side surfaces, formed on the surface of a semiconductor substrate with a gate dielectric layer therebetween; a first N-type impurity lightly doped drain (N-LDD) region, having a first impurity concentration, extending to a first depth below the surface of the semiconductor substrate and under the gate electrode from a side surface thereof; and a second N-LDD region, having a second impurity concentration greater than the first impurity concentration, to a second depth less than the first depth, forming a graded junction with the first concentration N-LDD region, wherein: the first N-LDD region contains an N-type impurity at a concentration of about $1\times10^{13}$ atoms $cm^{-3}$ to about $1\times10^{14}$ atoms $cm^{-3}$ and the second N-LDD region contains an N-type impurity at a concentration of about $5\times10^{13}$ atoms $cm^{-3}$ to about $5\times10^{14}$ atoms $cm^{-3}$.

Additional objects and advantages of the present invention will become readily apparent to those skilled in this art from the following detailed description, wherein only the preferred embodiment of the invention is shown and described, simply by way of illustration of the best mode contemplated for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

BEST MODE FOR CARRYING OUT THE INVENTION

Figure 1:
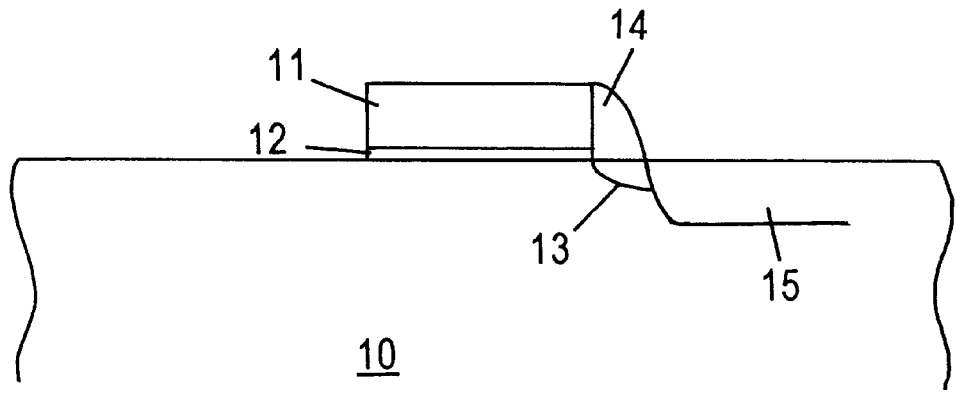
FIG. 1 schematically illustrates a conventional N-LDD-source/drain region junction.

The present invention enables the manufacture of semiconductor devices exhibiting a longer HCI lifetime by simplified methodology which does not require the use of a highly diffusive dopant, such as P. The present invention enables a significant increase in the HCI lifetime even in MOSFETs having a design rule of about 0.25 microns and under.

In accordance with the present invention, a low diffusivity N-type impurity, such as As, is implanted in two separate steps to form an N-LDD region having a graded junction. The use of a high diffusivity dopant, such as P, is avoided by employing plural angular implantations at different implantation energies and dosages of an N-type impurity having low diffusivity, such as As, to form a graded N-LDD junction.

In an embodiment of the present invention, a first angular ion implantation is conducted, employing a conventional angular implantation technique, such as rotational angular implantation. As used throughout the present application, the implantation angle denotes the angle between the ion beam and a line perpendicular to the surface of the semiconductor substrate. In accordance with an embodiment of the present invention, a first N-type impurity ion implanted at a first angle with respect to a line perpendicular to the upper surface of the semiconductor substrate under first implantation conditions, i.e., implantation dosage and energy, to form a first N-LDD implant. A second N-type impurity, preferably the same as the first, e.g., As, is ion implanted at a second angle less than the first angle, and at a second implantation dosage greater than the first implantation dosage and a second implantation energy less than the first implantation energy to form a second N-LDD implant shallower than the first N-LDD implant. The second high concentration N-LDD implant can also be conducted at an angle of about 0°, i.e., substantially perpendicular to the upper surface of the semiconductor substrate. After activation annealing, a first N-LDD region is formed extending under the gate electrode at a first impurity concentration and a second N-LDD region is formed, at substantially the same depth due to diffusion, below the semiconductor substrate and forming, with the first N-LDD region, a graded N-LDD junction. Embodiments of the present invention include forming a first low concentration N-LDD region extending below the surface of the semiconductor substrate to a depth of about 500 Å to about 1000 Å. Embodiments of the present invention further include forming a semiconductor device with a drain region extending to a depth of about 1500 Å to about 2000 Å below the surface of the semiconductor substrate.

The graded N-LDD junction improves the HCI lifetime and prevents transistor degradation by reducing the electrical field at the drain. In addition, by employing a relatively low implantation dosage, the first N-LDD region causes no significant adverse impact on the short channel effect. Given the objectives of the present invention, one having ordinary skill in the art can easily optimize the implantation conditions and angles in a particular situation. For example, in forming the first low concentration N-LDD implant using As, it was found suitable to employ an angle of about 30° to about 60° with respect to a line perpendicular to the upper surface of the semiconductor substrate, at an implantation dosage of about $1\times10^{14}$ atoms $cm^{-2}$ to about $1\times10^{14}$ atoms $cm^{-2}$ and at an implantation energy of about 30 KeV to about 45 KeV. In forming the second N-LDD implant using As, it was found suitable to employ an angle of about 0° to about 30° with respect to a line perpendicular to the surface of the semiconductor substrate, at an implantation dosage of about $5\times10^{13}$ atoms $cm^{-2}$ to about $5\times10^{14}$ atoms $cm^{-2}$ and at an implantation energy of about 20 KeV to about 35 KeV.

In accordance with the present invention, the first ion implantation and second ion implantation to form the N-LDD implants can be conducted simultaneously or in any order, i.e., the high dosage ion implantation can be conducted prior to the low dosage ion implantation. After activation annealing, the first N-LDD region extending under the gate electrode has an impurity concentration of about $5 \times 10^{17}$ atoms $cm^{-3}$ to about $5 \times 10^{18}$ atoms $cm^{-3}$, while the second N-LDD region, forming a graded junction with the first N-LDD region, has an impurity concentration of about $5 \times 10^{18}$ atoms $cm^{-3}$ to about $5 \times 10^{19}$ atoms $cm^{-3}$.

Subsequent to the plural angular implantations in accordance with the present invention to form the first and second N-LDD implants, processing can continue in accordance with conventional practices. For example, after forming the first and second N-LDD implants of the present invention and before activation annealing, a sidewall spacer is formed on the side surfaces of the gate electrode and an N-type impurity, such as As, is ion implanted at an implantation dosage of about $1 \times 10^{15}$ atoms $cm^{-2}$ to about $1 \times 10^{16}$ atoms $cm^{-2}$ and at an implantation energy of about 30 KeV to about 60 KeV to form a moderately or heavily doped drain implant, e.g., by vertical ion implantation employing the gate electrode and sidewall spacers as a mask. Activation annealing is then conducted at a temperature of about 1,000° C. to about 1,100° C. for a period of time of about 10 seconds to about 60 seconds to form the graded junction comprising a first low concentration N-LDD region and a second high concentration N-LDD region, adjoining a moderately or heavily doped drain region, which drain region typically has an impurity concentration of about $1 \times 10^{20}$ atoms $cm^{-3}$ to about $1 \times 10^{21}$ atoms $cm^{-3}$. The low concentration and high concentration N-LDD regions form a graded junction blending with the drain region, effectively reducing the electric field around the drain, thereby improving HCI lifetime and reducing transistor degradation by virtue of hot electron injection into the gate dielectric layer. Typically, the low concentration N-LDD implant extends under the gate electrode from a side surface thereof a distance of about 100 Å to about 500 Å.

Figure 2:
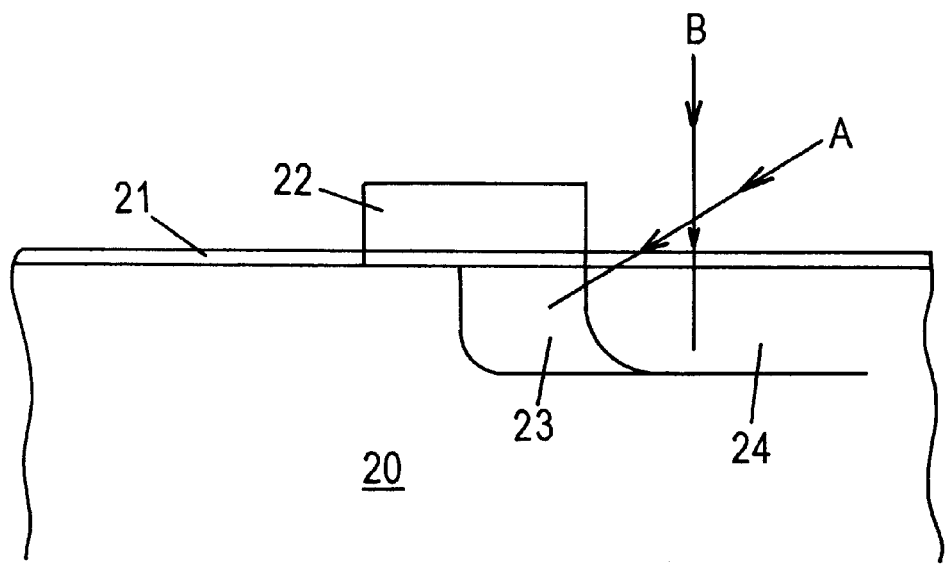
FIG. 2 illustrates an embodiment of the present invention.
Figure 3:
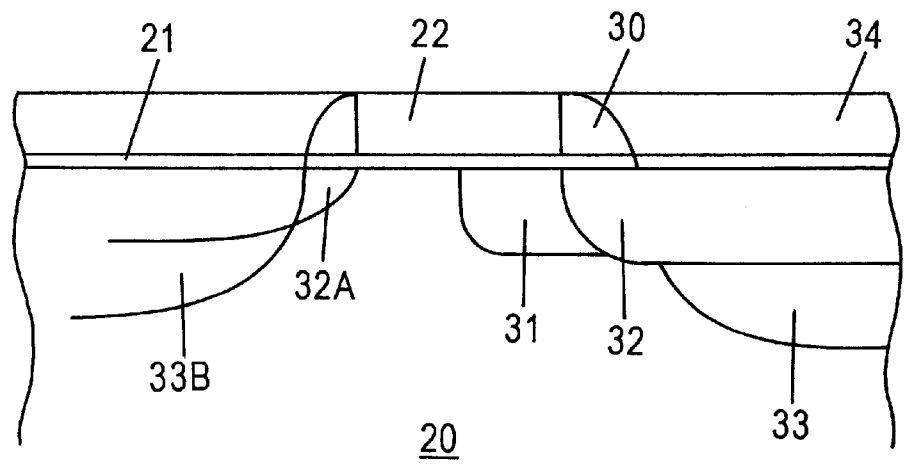
FIG. 3 illustrates another embodiment of the present invention.
Figure 4:
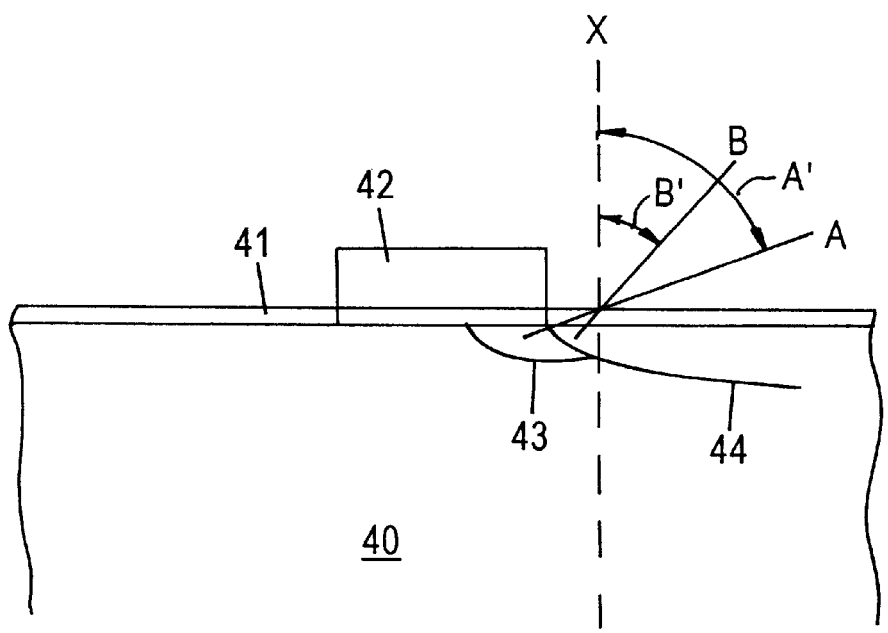
FIG. 4 illustrates another embodiment of the present invention.

Embodiments of the present invention are schematically illustrated in FIGS. 2 through 4. Adverting to FIG. 2, in accordance with the present invention, gate electrode 22 is formed on semiconductor substrate 20 with gate dielectric layer 21 therebetween. A first rotational angular ion implantation is performed, as shown by arrow A, to form a first low concentration N-LDD implant 23. Subsequently, a conventional N-LDD implant is conducted as indicated by substantially vertical arrow B to form a second high concentration N-LDD implant 24. First N-LDD implant 23 and second N-LDD implant 24 are subsequently activated to form a graded junction, thereby reducing the electric field around the drain, with an attendant increased HCI lifetime and reduced transistor degradation. Since a relatively low implantation dosage is employed to form the first low concentration N-LDD implant, e.g., about $10^{13}$ atoms $cm^{-2}$, there is no significant negative impact on the short channel effect, while the electric field around the drain is reduced.

Subsequent processing is conducted in a conventional manner, as by forming sidewall spacer 30 (FIG. 3) and ion implanting to form a moderately or heavily doped drain implant. Activation annealing is then conducted to form the depicted graded N-LDD junction adjoining a drain region. Adverting to FIG. 3, the graded N-LDD junction comprises a first low concentration N-LDD region 31 and a second high concentration N-LDD region 32 adjoining moderately or heavily doped drain region 33. The depicted embodiment also comprises source region 33B and adjoining N-LDD region 32A. As in conventional practices a dielectric interlayer 34 is then formed and planarized.

Another embodiment of the present invention is schematically illustrated in FIG. 4 wherein gate electrode 42 is formed on semiconductor substrate 40 with gate dielectric layer 41 therebetween. A low concentration ion implantation is conducted, indicated by arrow A, at an angle A' from a line perpendicular to the semiconductor substrate, to form low concentration N-LDD implant 43. A high concentration ion implantation is conducted, as indicated by arrow B, at an angle B' which is less than angle A', to form a high concentration N-LDD implant 44. The high concentration N-LDD implant can be formed at an implantation angle of about 0° to about 30°, while the low concentration N-LDD implant can be formed at an implantation angle of about 30° to about 60°. In the embodiment depicted in FIG. 4, the N-LDD junction depth is lower than the N-LDD junction depth of the embodiment depicted in FIG. 2, because the implantation angle for the high concentration N-LDD implant 43 is a greater than that employed in the FIG. 2 embodiment.

Thus, the present invention achieves a graded junction, thereby improving HCI lifetime while reducing transistor degradation by virtue of hot carrier injection into the gate oxide caused by the generation of a high electric field around the drain region. This object is achieved without the use of a high diffusivity element, such as P, which would increase the junction depth. The present invention comprises plural ion implantations at different implantation conditions. A low concentration N-LDD implant is formed at relatively low implantation dosage and higher energy but at a large angle with respect to a line perpendicular to the surface of the semiconductor substrate. A high concentration N-LDD implant is formed at a higher dosage and lower energy but at a smaller implantation angle that employed to form the low concentration N-LDD implantation. After activation annealing, the high and low concentration N-LDD implants extend to substantially similar depths in the substrate forming a graded N-LDD junction containing low and high N-LDD regions, thereby decreasing the peak electric field in the drain region with an attendant increase in HCI lifetime and reduction in transistor degradation by virtue of hot electron injection into the gate dielectric layer.

The present invention is applicable to the production of various types of semiconductor devices, particularly high density semiconductor devices with submicron features of about 0.25 microns and below exhibiting high speed characteristics and improved reliability. The present invention is cost effective and can easily be integrated into conventional processing.

In the various embodiments of the present invention, conventional materials and methodology are employed to form various components of a transistor and semiconductor device. For example, the semiconductor substrate employed in the various embodiments of the present invention typically comprises doped monocrystalline silicon, the dielectric layer typically comprises silicon oxide and the gate electrode typically comprises doped polycrystalline silicon.

In the previous descriptions, numerous specific details are set forth, such as specific materials, structures, chemicals, processes, etc., in order to provide a thorough understanding of the present invention. However, as one having ordinary skill in the art would recognize, the present invention can be practiced without resorting to the details specifically set forth. In other instances, well known processing structures have not been described in detail, in order not to unnecessarily obscure the present invention.

Only the preferred embodiment of the invention and but a few examples of its versatility are shown and described in the present disclosure. It is to be understood that the invention is capable of use in various other combinations and environments and is capable of changes or modifications within the scope of the inventive concept as expressed herein.

What is claimed is:

1. A method of manufacturing a semiconductor device, which method comprises:

forming a dielectric layer on a surface of a semiconductor substrate;

forming a conductive layer on the dielectric layer;

patterning to form a gate electrode, having side surfaces, on the surface of the semiconductor substrate with a gate dielectric layer therebetween;

ion implanting a first N-type impurity at a first angle with respect to a line perpendicular to the surface of the semiconductor substrate, at a first implantation dosage and at a first implantation energy to form a first N-type impurity lightly doped drain (N-LDD) implant having a first impurity concentration;

ion implanting a second N-type impurity at a second angle with respect to a line perpendicular to the surface of the semiconductor substrate less than the first angle, at a second implantation dosage greater than the first implantation dosage and at a second implantation energy less than the first implantation energy to form a second N-LDD implant having a second impurity concentration greater than the first impurity concentration; and activation annealing to form:
 a first low concentration N-LDD region extending under the gate electrode from a side surface thereof; and
 a second high concentration N-LDD region forming a graded junction with the first low concentration N-LDD implant.

2. The method according to claim 1, wherein the semiconductor device is a CMOS semiconductor device comprising N- and P-channel transistors having design features of 0.25 microns and under.

3. The method according to claim 2, wherein the N- and P-channel transistors comprise design features of about 0.18 microns and under.

4. The method according to claim 1, wherein the dielectric layer comprises a silicon oxide, and the substrate comprises doped monocrystalline silicon.

5. The method according to claim 4, wherein the gate electrode comprises doped polycrystalline silicon.

6. The method according to claim 1, wherein the second N-type impurity is the same as the first N-type impurity.

7. The method according to claim 6, wherein the first and second N-type impurity is arsenic.

8. The method according to claim 7, comprising ion implanting arsenic at a first angle of about 30° to about 60°, at a first implantation dosage of about $1 \times 10^{13}$ atoms $cm^{-2}$ to about $1 \times 10^{14}$ atoms $cm^{-2}$, and at a first implantation energy of about 30 KeV to about 45 KeV, to form the first N-LDD implant.

9. The method according to claim 8, comprising implanting arsenic at a second angle of about 0° to about 30°, at a second implantation dosage of about $5 \times 10^{13}$ atoms $cm^{-2}$ to about $5 \times 10^{14}$ atoms $cm^{-2}$, and at a second implantation energy of about 20 KeV to about 35 KeV, to form the second N-LDD implant.

10. The method according to claim 9, comprising activation annealing at about 1,000° C. to about 1,100° C. for about 10 seconds to about 60 seconds.

11. The method according to claim 1, wherein the first low concentration N-LDD region extends below the surface of the semiconductor substrate to a depth of about 500 Å to about 1,000 Å.

12. The method according to claim 1, wherein the first low concentration N-LDD region extends under the gate electrode a distance of about 100 Å to about 500 Å from a side surface thereof.

13. The method according to claim 1, comprising forming the first N-LDD implant before forming the second N-LDD implant.

14. The method according to claim 1, comprising forming the first N-LDD implant after forming the second N-LDD implant.

15. The method according to claim 1, comprising simultaneously ion implanting to form the first and second N-LDD implants.

16. The method according to claim 1, further comprising:

forming an insulating sidewall spacer on the side surfaces of the gate electrode after forming the second N-LDD implant;

ion implanting an N-type impurity at an implantation dosage of about $1 \times 10^{15}$ atoms $cm^{-2}$ to about $1 \times 10^{16}$ atoms $cm^{-2}$ at an implantation energy of about 30 KeV to about 60 KeV to form a moderately or heavily doped source/drain implant; and activation annealing to form the first and second N-LDD regions and a moderately or heavily doped drain region.

17. The method according to claim 16, wherein the drain region extends to a depth of about 1,500 Å to about 2,000 Å below the surface of the semiconductor substrate.

18. The method according to claim 1, comprising ion implanting the second N-type impurity at the second angle before ion implanting the first N-type impurity at the first angle.

* * * * *